United States Patent [19]

Yamamoto

[11] Patent Number: 4,961,105
[45] Date of Patent: Oct. 2, 1990

[54] ARRANGEMENT OF A SEMICONDUCTOR DEVICE FOR USE IN A CARD

[75] Inventor: Hiroshi Yamamoto, Ibaragi, Japan

[73] Assignee: Hitachi Maxell, LTD, Osaku, Japan

[21] Appl. No.: 299,609

[22] Filed: Jan. 23, 1989

Related U.S. Application Data

[63] Continuation of Ser. No. 11,197, Feb. 5, 1987, abandoned.

[30] Foreign Application Priority Data

Feb. 6, 1986 [JP] Japan ................. 61-22960

[51] Int. Cl.⁵ ............................ H01L 23/28
[52] U.S. Cl. .................... 357/72; 174/52.4; 357/70
[58] Field of Search ............ 174/52.4; 235/487, 492; 357/70, 72

[56] References Cited

U.S. PATENT DOCUMENTS

| 3,597,834 | 8/1971 | Lathrop | 174/68.5 X |
| 4,142,203 | 2/1979 | Dietz | 357/80 |
| 4,190,855 | 2/1980 | Inoue | 357/80 |
| 4,264,917 | 4/1981 | Ugon | 357/74 |
| 4,437,228 | 3/1984 | Yamamoto et al. | 174/52 F P X |
| 4,447,716 | 5/1984 | Aigo | 235/487 X |
| 4,475,007 | 10/1984 | Ohno | 174/52 F P |
| 4,483,067 | 11/1984 | Parmentier | 235/492 X |
| 4,625,102 | 11/1986 | Rebjock et al. | 235/492 |
| 4,649,418 | 3/1987 | Uden | 357/80 |
| 4,677,528 | 6/1987 | Miniet | 235/492 X |
| 4,691,225 | 9/1987 | Muarakami et al. | 174/52 F P X |
| 4,709,254 | 11/1987 | Tehrani et al. | 357/72 |
| 4,719,140 | 1/1988 | Hara et al. | 235/492 X |
| 4,737,620 | 4/1988 | Mollett | 235/492 |

FOREIGN PATENT DOCUMENTS 2047474 8/1979 United Kingdom .
2084399 9/1981 United Kingdom .

OTHER PUBLICATIONS

WO 82/02457, International Publ #, 7/82 including International Patent Search, 10 pages.
34th Electronic COmponents Conference, 4 pages, New Orleans, La., May 14–16, 1984.

Primary Examiner—Morris H. Nimmo

[57] ABSTRACT

A card like semiconductor device comprising a circuit board made of plastic resin and a semiconductor pellet mounted to the circuit board, wherein a metal layer is formed on one surface of the semiconductor pellet on which semiconductor circuit is not formed. The semiconductor pellet is secured to the circuit board by bonding the metal layer to the circuit board and is sealed with a high polymer material on the circuit board.

23 Claims, 3 Drawing Sheets

ARRANGEMENT OF A SEMICONDUCTOR DEVICE FOR USE IN A CARD

This application is a continuation, of application Ser. No. 07/011,197 filed on Feb. 5, 1987, now abandoned.

BACKGROUND OF THE INVENTION

1. FIELD OF THE INVENTION

The present invention relates to a semiconductor device and more particularly to an arrangement of a semiconductor device suitable for mounting in a thin card.

2. DESCRIPTION OF THE PRIOR ART

It has been known to mount one or more integrated circuits (IC), or very large scale integrated circuits (VLSI) in a card to be used in card like semiconductor devices such as IC cards, electronic calculators or electronic watches. One of the requirements in such card like semiconductor devices is to make them thin.

An example of the conventional card like semiconductor device is shown in FIG. 1, wherein a circuit board 11 made of a hard material such as an alloy plate is mounted with a semiconductor pellet 13 which is bonded on the circuit board 11 by an organic adhesive 12 such as an epoxy adhesive and necessary wiring terminals are formed on the upper surface of the pellet 13 which connect the circuits on the board by means of bonding wires 14. After the necessary wire bonding is completed, the entire semiconductor pellet 13 and the bonding wires are sealed by a plastic resin 15. In the arrangement of the conventional card like semiconductor device shown in FIG. 1, the thickness D1 of the pellet mounting portion of the card like semiconductor device comprises the thickness d1 of the circuit board 11, a thickness d2 of the semiconductor pellet 13 and the thickness d3 of the resin sealing portion 15. Therefore, the difficulty of making the card like semiconductor device thinner is limited by these thicknesses.

One approach of solving the problem mentioned above is to decrease the thickness of the circuit board 11 keeping the desired mechanical strength by using a strong plastic sheet such as a polyimide resin sheet. In addition to the above technique, as shown in FIG. 2, through hole 16 in the circuit board 11 so that the semiconductor pellet 13 can be embedded in the through hole 16. In the arrangement shown in FIG. 2, an annular reinforcing wall 17 is formed around the through hole 16 on the side where the bonding wires 14 protrude. The plastic resin is injected in the hole 16 and the area surrounded by the wall 17 so as to seal the bonding wires 14 and the semiconductor pellet 13.

According to the arrangement shown in FIG. 2, a thickness D2 of the pellet mounting portion of the card like semiconductor device is comprises of the thickness d2 of the semiconductor pellet 13 and a height d3 of the reinforcing wall 17 or the thickness of the resin sealing portion 15, whereby the total thickness can be decreased by the thickness d1 of the circuit board 11 in FIG. 1.

Conventionally, the semiconductor pellets 13 having a 0.4 mm to 0.5 mm thickness are used in the card like semiconductor device and in order to decrease the thickness of the card like semiconductor device, the use of a semiconductor pellet 13 thinner than 0.4 mm has been proposed. However, such semiconductor pellets thinner than 0.4 mm are not commercially available, and it is proposed to grind the semiconductor pellet to decrease the thickness thereof.

Besides, as the semiconductor pellet is usually made of hard but brittle material such as silicon, mechanical resistance is low and the semiconductor pellet is easily broken by a small external force.

In the case when the semiconductor pellet 13 is mounted on the circuit board 11 made of a mechanically strong material through the metallic bonding agent 12, since the external force can be received by the circuit board, it is possible to prevent the semiconductor pellet 13 from being subjected to the external force directly, therefore, brittleness of the silicon semiconductor pellet 13 scarcely causes damage of the pellet. However, in the case when the semiconductor pellet 13 is used in card like semiconductor device without securing the bottom of the pellet as shown in FIG. 2, the semiconductor pellet 13 is easily broken by various forces such as a shrinking force of the plastic resin 15 when the plastic resin is injected and cured or by the thermal stress caused by the difference of the thermal expansion coefficient of the sealing resin material and the semiconductor pellet 13 or the external force acting directly to the semiconductor pellet 13, whereby an abnormal condition of the IC characteristic of the semiconductor pellet 13 occurs. Particularly, in the case when the semiconductor pellet 13 is made thin by grinding the bottom face thereof, a grinding flaw may be formed on the bottom face of the semiconductor pellet 13 and such grinding flaws grows to micro cracks towards the inside of the semiconductor pellet 13, thereby resulting in concentration of the stress at the cracks. Therefore, the semiconductor pellets which are ground for decreasing the thickness of the card like semiconductor devices are easier to break compared to those which are not ground. This means that the arrangement of the card like semiconductor device shown in FIG. 2 is also unavailable for the commercial use.

Moreover, the card like semiconductor device shown in FIG. 2 has a manufacturing problem that will be described below.

According to the arrangement shown in FIG. 2, since it is impossible to secure the semiconductor pellet 13 directly on the circuit board 11, it is necessary to preliminarily put the semiconductor pellet 13 on a fixing device such as a vacuum suction device in the wire bonding process. In turn, the position of the circuit board 11 must be adjusted so that the semiconductor pellet 13 is placed near the center of the through hole 16 of the circuit board 11 by means of suitable positioning equipment. Such a process prevents an automatic assembling of the semiconductor pellet 13 on the circuit board 11 from being employed thereby causing low productivity. Moreover, in various processes from the wire bonding process to the resin sealing process, since the semiconductor pellet 13 is not secured, the bonding wires tend to be broken when there are transferred, thus yield is low.

SUMMARY OF THE INVENTION

An essential object of the present invention is to provide a card like semiconductor device which is thinner than the conventional card like semiconductor device with relatively high strength.

Another object of the present invention is to provide a card like semiconductor device which can be manufactured with a high productivity and a high yield.

In order to accomplish the objects of the present invention, a card like semiconductor device is provided comprising a circuit board made of plastic resin and a semiconductor pellet mounted to the circuit board. Wherein the improvement comprises a metal layer formed on one surface of the semiconductor pellet on which the semiconductor circuit is not formed, and semiconductor pellet is secured to the circuit board by bonding the metal layer to the circuit board and sealing with a high polymer material on the circuit board.

The card like semiconductor device according to the present invention is further defined by a recess in the circuit board with a bottom for the accommodation of the semiconductor pellet.

These and other objects and features of the card like semiconductor device according to the present invention will be apparent from the detailed description of the preferred embodiment with reference to the attached drawings.

DETAILED DESCRIPTION OF THE PREFERRED EMBODIMENTS

Figure 1:
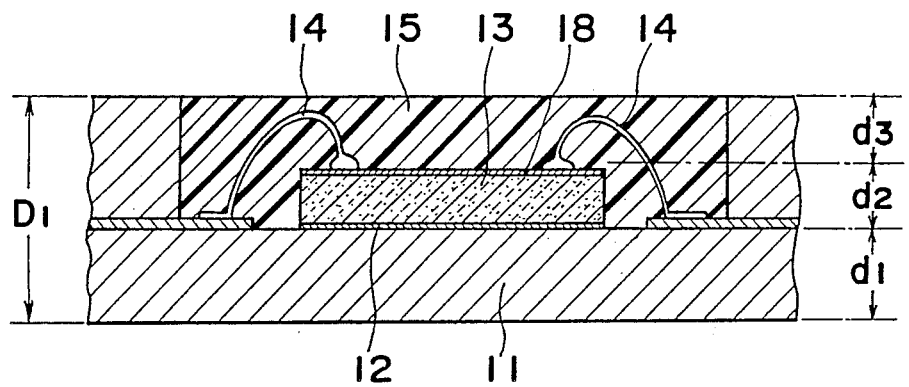
FIG. 1 is a cross sectional view of a first example of a conventional card like semiconductor device.
Figure 2:
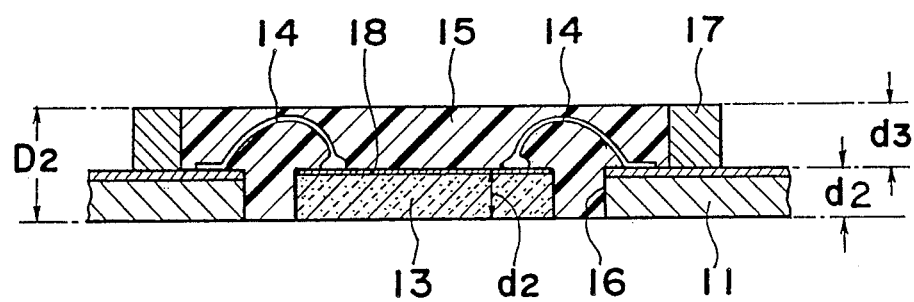
FIG. 2 is a cross sectional view of a second example of a conventional card like semiconductor device.
Figure 3:
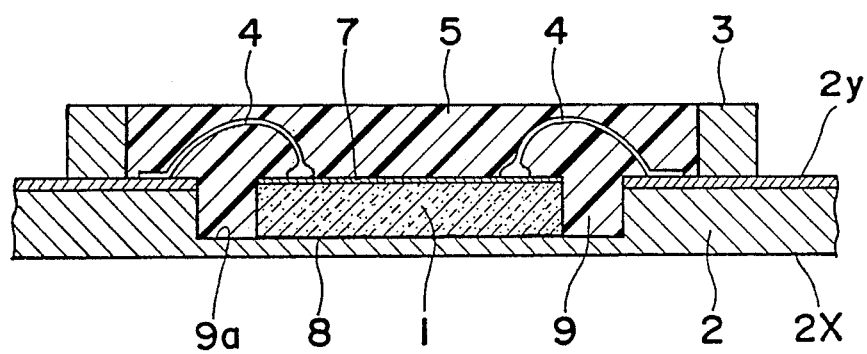
FIG. 3 is a cross sectional view of an example of a card like semiconductor device according to the present invention.

Referring to FIG. 3, reference numeral 1 denotes a semiconductor pellet, 2 a circuit board, 3 a frame body formed on one of the surface circuit board 2, 4 the bonding wires and 5 the sealing resin.

A metal layer 8 is formed on the bottom of the semiconductor pellet 1 i.e., on one of the faces of the pellet on which none of the semiconductor circuit patterns are provided. Such a metal layer 8 is formed in a final process of preparing a silicon wafer. Various metals can be used for the metal layer 8, however, in order to increase the bonding strength of the silicon wafer and the metal layer 8, metals that alloy with the silicon are preferred. Specifically, at least one kind of metal selected from the group consisting of gold, nickel, aluminum, chromium and molybdenum should be used for the metal layer 8.

The metal layer 8 may be formed by way of vacuum evaporation, sputtering or plating.

Moreover, after the metal layer 8 is formed on the silicon wafer or in the process of making the metal layer, the silicon wafer may be heated to progress the mutual diffusion between the metal layer and the silicon wafer so that an alloy layer in the interface of the metal layer and the silicon wafer is formed.

The circuit board 2 is formed by a base 2x made of heat resist material such as polyimide resin or epoxy resin containing glass fiber having its central portion defined by a recess 9 for accommodating the semiconductor pellet 1 and a metallic circuit pattern 2y made of a copper layer formed on the base 2x. The depth of the recess 9 is so defined that the upper surface of the semiconductor pellet 1 is generally flush with the upper surface of the metallic pattern 2y when the semiconductor pellet 1 is put on the bottom of the recess 9.

The frame body 3 having a generally annular shape is made of a thin metal plate such as a stainless steel sheet and is disposed on the surface of the metallic layer 2y so as to surround the recess 9.

The semiconductor pellet 1 is secured on the bottom wall 9a of the recess 9 by bonding the metal layer 8 of the semiconductor pellet 1 with the bottom wall 9a by an organic adhesive such as a epoxy adhesive and the semiconductor pellet 1 is sealed with sealing resin 5 after wire bonding using the bonding wires 4 is completed, whereby the circuit board 2 and the semiconductor pellet 1 are integrally bonded together. The sealing resin 5 is filled in the space of the recess 9 not occupied by the semiconductor pellet 1 and the space surrounded by the frame body 3 with the bonding wires 4.

Any hard, high molecular composition such as epoxy resin, acrylic resin may be used as the sealing resin. Particularly, acrylic resin is preferred because the acrylic resin can be cured by ultraviolet rays under the normal temperature, so that the semiconductor pellet 1 can be sealed.

In the card like semiconductor device mentioned above, the circuit board 2 is made of a film of polyimide so that the circuit board 2 per se can be made thin. In addition, as the semiconductor pellet 1 is adapted to be accommodated in the recess 9 defined in the circuit board 2, the thickness of the card like semiconductor device at the portion where the semiconductor pellet 1 is placed can be decreased by such a thickness as the decrement of thickness of the circuit board 2 per se and the depth of the recess 9 compared to the thickness of the conventional card like semiconductor device in which the semiconductor pellet is mounted directly on the top surface of the flat circuit board.

Moreover, since the semiconductor pellet 1 has its bottom face formed with the metal layer 8 so as to reinforce the semiconductor pellet 1, the mechanical strength of the semiconductor pellet 1 can be stronger than the conventional semiconductor pellet without a reinforcing layer. This means that according to the embodiment of the card like semiconductor device mentioned above, the semiconductor pellet 1 can be prevented from being broken without securing the pellet 1 on a circuit board made of a highly rigid material.

Figure 4:
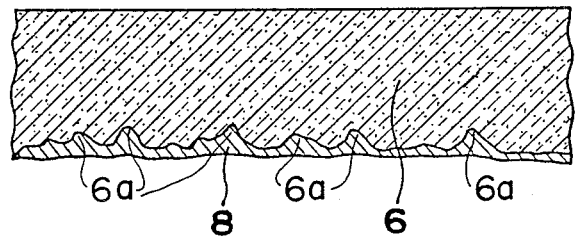
FIGS. 4 to 6 are respectively cross sectional views showing various examples of the semiconductor pellet used in the embodiment shown in FIG. 3.

With the metal layer 8 formed on the bottom face of the wafer 6 as shown, concaved portions 6a are filled with the metal layer as shown in FIG. 4, so that the bottom face of the wafer 6 can be remarkably smooth to prevent concentration of the stress, thereby improving the mechanical strength of the wafer 6 or semiconductor pellet 1.

Figure 5:
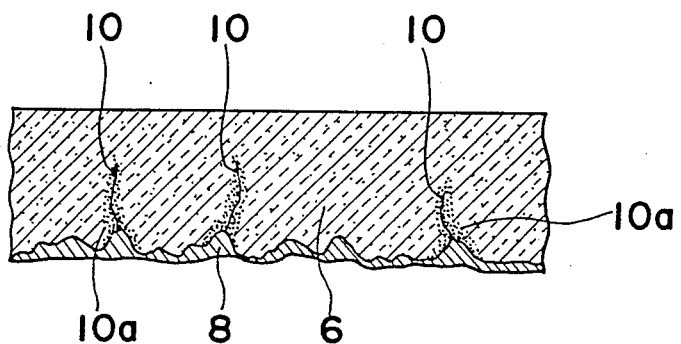
Figure 6:
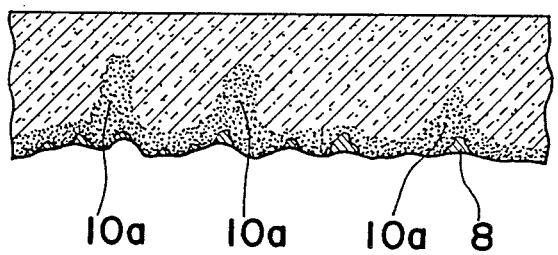

In addition, by heating the wafer 6 with the metal layer 8, it is possible to progress the mutual diffusion of the atoms of the silicon wafer 6 and the metal atoms of the metal layer 8 as shown in FIG. 5. The surface diffusion which is developed along the surface of the substance is quicker than the lattice diffusion which is developed towards the inside of the substance, therefore, the metal atoms of the metal layer 8 are rapidly diffused along the surface of the microcracks 10, whereby as shown in FIG. 6, uniform alloyed portions 10a are formed near the respective microcracks 10 filling the cracks, whereby the concentration of the stress is decreased and the mechanical strength of the pellet 1 can be increased. Thus, it becomes possible to use the semiconductor pellet in which the wafer is ground to decrease the thickness of the pellet which decreases the total thickness of the card like semiconductor device.

Specific examples of the card like semiconductor device according to the present invention will be described hereinafter.

A plurality of silicon wafers were prepared and each of them were ground by means of grinding sands of NO. WA 4000 so as to prepare original wafers each having 0.3 mm thickness with grinding scratches formed on one surface. Subsequently, each of the original silicon wafers was formed with the metal layer of 1 μm thick on the ground surface under the conditions listed in the table 1, whereby there were produced 21 samples formed by different materials for the metal layer 8 and by different processes, under different heating conditions and in different atmospheres at the time of heating.

TABLE 1

| EX. NO. | metal layer | method | heating temp. | atmosphere |
|---|---|---|---|---|
| 1 | Au | sputter | 300–400° C. | air |
| 2 | Au | V.E. | 300–400 ° C. | air |
| 3 | Au | plating | 300–400° C. | air |
| 4 | Ag | sputter | 400–500° C. | air |
| 5 | Ag | V.E. | 400–500° C. | air |
| 6 | Ag | plating | 400–500° C. | air |
| 7 | Ni | sputter | 400–500° C. | neutral gas |
| 8 | Ni | sputter | 400–500° C. | reducing gas |
| 9 | Ni | sputter | 400–500° C. | vacuum |
| 10 | Ni | V.E. | | |
| 11 | Ni | plating | 400–500° C. | neutral gas |
| 12 | Ni | plating | 400–500° C. | reducing gas |
| 13 | Ni | plating | 400–500° C. | vacuum |
| 14 | Al | sputter | 400–500° C. | neutral gas |
| 15 | Al | sputter | 400–500° C. | reducing gas |
| 16 | Al | sputter | 400–500° C. | vacuum |
| 17 | Al | V.E. | 400–500° C. | neutral gas |
| 18 | Al | V.E. | 400–500° C. | reducing gas |
| 19 | Al | V.E. | 400–500° C. | vacuum |
| 20 | Au | V.E. | 250–300° C. | air |
| 21 | Au | plating | 250–300° C. | neutral gas |

V.E.; vacuum evaporation

EXAMPLE 1

Gold was coated on the ground surface of the silicon wafer by sputtering to a 1 μm thickness and subsequently, the sample was heated 300° C. to 400° C. for ten minutes in a heating furnace thereby causing silicon and gold to be mutually diffused to form an Au-Si eutectic alloy layer on the ground surface of the silicon wafer.

EXAMPLE 2

Gold was coated on the ground surface of the silicon wafer by a vacuum evaporation to a 1 μm thickness and subsequently, the sample was heated 300° C. to 400° C. for ten minutes in a heating furnace, thereby causing silicon and gold to be mutually diffused to form an Au-Si eutectic alloy layer on the ground surface of the silicon wafer.

EXAMPLE 3

Gold was coated on the ground surface of the silicon wafer by plating to a 1 μm thickness and subsequently, the sample was heated 300° C. to 400° C. for ten minutes in a heating furnace, thereby causing silicon and gold to be mutually diffused to form an Au-Si eutectic alloy layer on the ground surface of the silicon wafer.

EXAMPLE 4

Silver was coated on the ground surface of the silicon wafer by sputtering to a 1 μm thickness and subsequently, the sample was heated 400° C. to 500° C. for ten minutes in a heating furnace, thereby causing silicon and silver to be mutually diffused to form an Ag-Si eutectic alloy layer on the ground surface of the silicon wafer.

EXAMPLE 5

Silver was coated on the ground surface of the silicon wafer by vacuum evaporation to a 1 μm thickness and subsequently, the sample was heated 400° C. to 500° C. for ten minutes in a heating furnace thereby causing silicon and silver to be mutually diffused to form an Ag-Si eutectic alloy layer on the ground surface of the silicon wafer.

EXAMPLE 6

Silver was coated on the ground surface of the silicon wafer by plating to a 1 μm thickness and subsequently, the sample was heated 400° C. to 500° C. for ten minutes in a heating furnace, thereby causing silicon and silver to be mutually diffused to form an Ag-Si eutectic alloy layer on the ground surface of the silicon wafer.

EXAMPLE 7

Nickel was coated on the ground surface of the silicon wafer by sputtering to a 1 μm thickness in a vacuum container and subsequently, neutral gas was introduced in the chamber and the sample was kept in the atmosphere of the neutral gas at 400° C. to 500° C. for ten minutes, thereby causing silicon and nickel to be mutually diffused to form Ni-Si alloy layer on the ground surface of the silicon wafer.

EXAMPLE 8

Nickel was coated on the ground surface of the silicon wafer by sputtering to a 1 μm thickness and subsequently, reducing gas was introduced in the chamber and the sample was kept in the atmosphere of the reducing gas at 400° C. to 500° C. for ten minutes, thereby causing silicon and nickel to be mutually diffused to formed a Ni-Si alloy layer on the ground surface of the silicon wafer.

EXAMPLE 9

Nickel was coated on the ground surface of the silicon wafer by sputtering to a 1 μm thickness and subsequently, the sample was kept in the vacuum at 400° C. to 500° C. for ten minutes, thereby causing silicon and nickel to be mutually diffused to form a Ni-Si alloy layer on the ground surface of the silicon wafer.

EXAMPLE 10

Nickel was coated on the ground surface of the silicon wafer by vacuum evaporation with to a 1 μm thickness thus a Ni layer was formed on the ground surface.

EXAMPLE 11

Nickel was coated on the ground surface of the silicon wafer by plating to a 1 μm thickness and subsequently, the sample was accommodated in a container to which neutral gas was introduced and the sample was kept in the atmosphere of the neutral gas at 400° C. to 500° C. for ten minutes, thereby causing silicon and nickel to be mutually diffused to form a Ni-Si alloy layer on the ground surface of the silicon wafer.

EXAMPLE 12

Nickel was coated on the ground surface of the silicon wafer by plating to a 1 μm thickness and subsequently, the sample was accommodated in a container to which reducing gas was introduced and the sample was kept in the atmosphere of the restoration gas at 400° C. to 500° C. for ten minutes, thereby causing silicon and nickel to be mutually diffused to form a Ni-Si alloy layer on the ground surface of the silicon wafer.

EXAMPLE 13

Nickel was coated on the ground surface of the silicon wafer by plating to a 1 μm thickness and subsequently, the sample was accommodated in a vacuum container and the sample was kept in the high vacuum atmosphere at 400° C. to 500° C. for ten minutes, thereby causing silicon and nickel to be mutually diffused to form a Ni-Si alloy layer on the ground surface of the silicon wafer.

EXAMPLE 14

Aluminum was coated on the ground surface of the silicon wafer by sputtering to a 1 μm thickness and subsequently, neutral gas was introduced in the chamber and the sample was kept in the atmosphere of the neutral gas at 400° C. to 500° C. for ten minutes, thereby causing silicon and aluminum to be mutually diffused to form an Al-Si eutectic alloy layer on the ground surface of the silicon wafer.

EXAMPLE 15

Aluminum was coated on the ground surface of the silicon wafer by sputtering to a 1 μm thickness and subsequently reducing gas was introduced in the vacuum container and the sample was kept in the atmosphere of the reducing gas at 400° C. to 500° C. for ten minutes, thereby causing silicon and aluminum to be mutually diffused to form an Al-Si eutectic alloy layer on the ground surface of the silicon wafer.

EXAMPLE 16

Aluminum was coated on the ground surface of the silicon wafer by sputtering to a 1 μm thickness and the sample was kept in the vacuum at 400° C. to 500° C. for ten minutes, thereby causing silicon and aluminum to be mutually diffused to form an Al-Si eutectic alloy layer on the ground surface of the silicon wafer.

EXAMPLE 17

Aluminum was coated on the ground surface of the silicon wafer by vacuum evaporation to a 1 μm thickness in a vacuum chamber and subsequently, neutral gas was introduced in the chamber and the sample was kept in the atmosphere of the neutral gas at 400° C. to 500° C. for ten minutes, thereby causing silicon and aluminum to be mutually diffused to form an Al-Si eutectic alloy layer on the ground surface of the silicon wafer.

EXAMPLE 18

Aluminum was coated on the ground surface of the silicon wafer by vacuum evaporation to a 1 μm thickness in a chamber and subsequently, reducing gas was introduced in the chamber and the sample was kept in the atmosphere of the reducing gas at 400° C. to 500° C. for ten minutes, thereby causing silicon and aluminum to be mutually diffused to form an Al-Si eutectic alloy layer on the ground surface of the silicon wafer.

EXAMPLE 19

Aluminum was coated on the ground surface of the silicon wafer by vacuum evaporation to a 1 μm thickness in a chamber and the sample was kept in the vacuum at 400° C. to 500° C. for ten minutes, thereby causing silicon and aluminum to be mutually diffused to form an Al-Si eutectic alloy layer on the ground surface of the silicon wafer.

EXAMPLE 20

Gold was coated on the ground surface of the silicon wafer by vacuum evaporation to a 1 μm thickness and subsequently, the sample was kept in a heating furnace at 250° C. to 300° C. for five minutes, thereby causing silicon and gold to be mutually diffused only in the interface of the wafer and gold layer to form an Au-Si eutectic alloy layer formed on the ground surface of the silicon wafer, further layer a monometallic gold remained on the alloy layer.

EXAMPLE 21

Gold was coated on the ground surface of the silicon wafer by plating to a 1 μm thickness and subsequently, the sample was accommodated in a container to which neutral gas was introduced and kept in the container at 250° C. to 300° C. for five minutes, thereby causing silicon and gold to be mutually diffused to form an Au-Si eutectic alloy layer on the ground surface of the silicon wafer, further a monometallic gold layer remained on the alloy layer.

The semiconductor pellets produced by scribing the respective wafers produced in the manner mentioned in the examples 1 to 21 and wafers without alloy layers were respectively mounted on circuit boards as shown in FIG. 3. Then the respective circuit boards with the pellets were subjected to 100 times of repetitive bending of ±15%. There occurred 1% to 2% inoperable pellets in the pellets having wafers without an alloy layer. On the other hand, all of the pellets mounted with the wafers having the alloy layers of the examples 1 to 21 were kept operable.

The difference of the durability were not recognized among all examples 1 to 21. Thus it becomes apparent that in the card device according to the present invention, the difference of in kinds of the material of the metal layer, the way of forming the metal layer, the degree of the diffusion of the metal in the wafer does not causes the difference in the durability of the semiconductor pellets.

Figure 7:
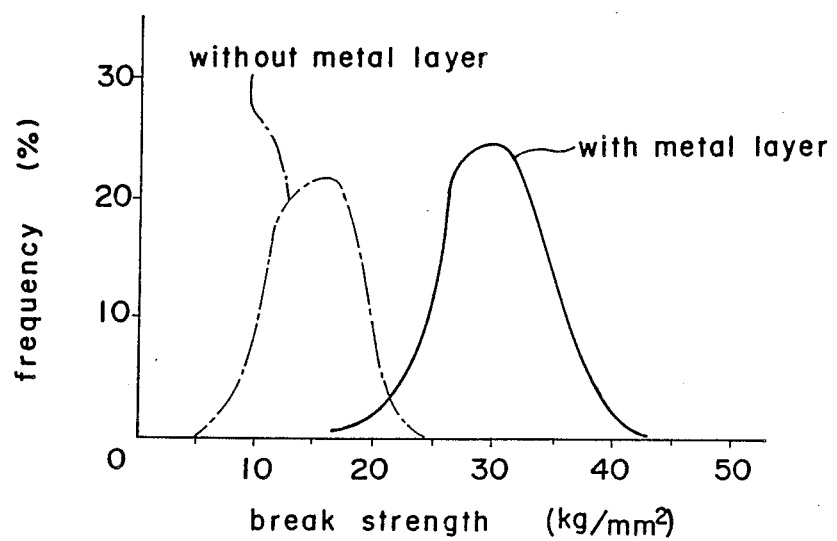
FIG. 7 shows graphs of the characteristics of the break strength of the semiconductor pellets.

Tests of the break strength were conducted about the respective examples 1 to 21 and the pellets without the alloy layer. The result is shown in FIG. 7, in which the horizontal axis represents the break strength and the vertical axis represents the ratio between the number of broken pellets and the total number of pellets.

As apparent from the graphs, the semiconductor pellets obtained by scribing the wafers without the metal layer on the ground surface are distributed over the range of 6 kgf/mm² to 24 kgf/mm² of the break strength and the average value is 15.9 kgf/mm² with a standard deviation of 4.39. On the other hand, the semiconductor pellets obtained by scribing the wafers having the metal or alloy layer on the ground surface are distributed over the range of 17 kgf/mm² to 43 kgf/mm² of the break strength and the average break strength is 29.9 kgf/mm² with the standard deviation 5.69. Thus the semiconductor pellets formed by the wafers having the alloy layer show an amount of about twice the break strength than the wafers without the metal alloy and the deviation of the break strength is decreased.

Figure 8:
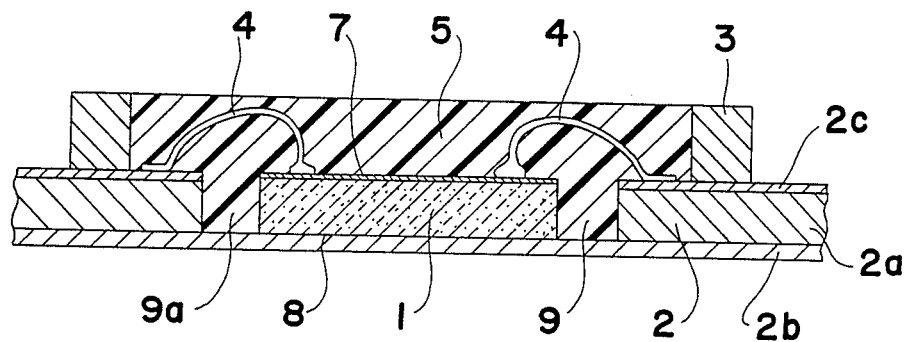
FIG. 8 is a cross sectional view of another example of the card like semiconductor device according to the present invention.

Another embodiment of the card like semiconductor device according to the present invention is shown in FIG. 8 in which the circuit board 2 is formed by laminating a polyimide sheet 2a of a 0.2 to 0.3 mm thickness and another polyimide sheet 2b of about a 0.1 mm thickness. The circuit board 2 has its top surface provided with the circuit patterns 2c made of a copper film of about 35 μm thickness. The recess 9 for accommodation of the semiconductor pellet 1 is defined in the polyimide sheet 2a.

Figure 9:
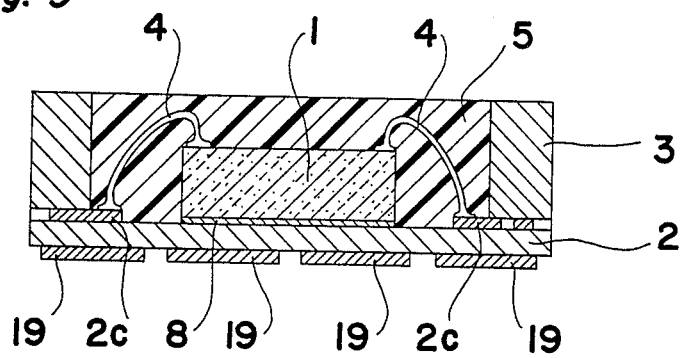
FIG. 9 is a cross sectional view of a further example of the card like semiconductor device according to the present invention.

A further embodiment of the card like semiconductor device according to the present invention is shown in FIG. 9 in which the circuit board 2 is provided with a circuit pattern of about 35 μm formed on the top surface thereof and further circuit patterns 19 formed on the bottom face of the circuit board. The circuit board 2 has about 0.1 mm thickness and is made of epoxy resin containing glass fibers.

Figure 10:
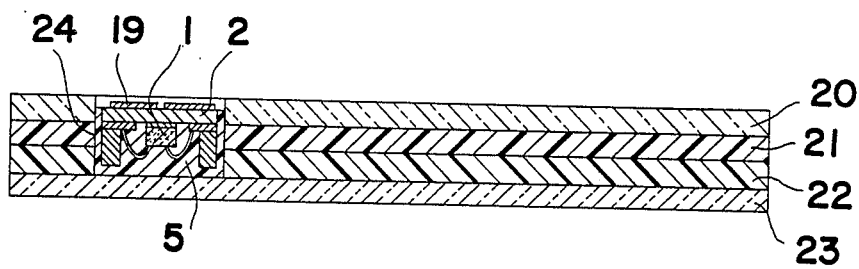
FIG. 10 is a cross sectional view of a further example of the card like semiconductor device according to the present invention.

FIG. 10 shows an example of an IC card employing the card like semiconductor device as shown in FIG. 9. As shown, the card like semiconductor device is embedded in a space 24 defined in a card body made by laminated core sheets 21 and 22 each made of an opaque vinyl chloride sheet with the top face of the core sheet 21 printed by possible description. The core sheets 21 and 22 are covered with transparent vinyl chloride sheets 20 and 23.

Although the card like semiconductor device according to the present invention is explained with reference to the various examples, the present invention is not limited to the examples and various modifications and variations can be made to those skilled in the art.

For examples, although as the metals for the alloy layer gold, silver, nickel and aluminum are used, there may be used various metals such as chromium or molybdenum so far as it is available to form the alloy with the material of the wafer.

The metal layer on the wafer may be formed by any methods for forming the thin metal film.

Moreover, in the present invention, the metal layer may be formed on a surface of a wafer without grinding.

As the way of connecting the circuit pattern of the circuit board and circuit pattern of the semiconductor pellet, various connecting methods such as a gang bonding method, a face down method or other conventional connecting methods may be used.

It is noted that in the case when the card like semiconductor device according to the present invention is employed in a plastic sheet of vinyl chloride such as an IC card, an ID card or a bank card, it is possible to provide an extremely thin card device which is easy to use with a high mechanical strength.

According to the present invention, since the metal layer is formed on one surface of the pellet on which semiconductor circuit is not provided, the mechanical strength of the pellet can be reinforced, enabling the mechanical strength to increase. Furthermore, increase of the mechanical strength of the pellet by the metal layer enables a decrease in the thickness of the pellet so that the total thickness of the card like semiconductor device can be decreased.

Moreover, since the pellet can be secured to the circuit board or substrate before wire bonding, the process of wire bonding may be easy because it is not necessary to preliminarily secure the pellet and circuit board or substrate to separate securing tools, whereby the arrangement of the card like semiconductor device according to the present invention enables an automatic production improvement in the workability and productivity to be employed.

Moreover, since the pellet is secured to the circuit board or substrate, breakage of the bonding wires connecting the pellet and circuit board does not occur in the processes after the wire bonding up to resin sealing, the yield of the card like semiconductor device can be improved.

What is claimed is:

1. A card like semiconductor device comprising:
   a silicon semiconductor pellet having semiconductor circuitry on a top surface and a metal reinforcing layer forming a bottom surface, said metal reinforcing layer including a silicon alloy layer being diffused to said bottom surface;
   a plastic resin circuit board having a relatively thin pellet securing surface on which said metal reinforcing layer forming the bottom surface of said silicon semiconductor pellet is bonded by an organic adhesive;
   a high polymer material for sealing said silicon semiconductor pellet to said plastic resin circuit board; and
   said metal reinforcing layer stiffening the mechanical strength of said silicon semiconductor pellet so that the relatively thin pellet securing surface of said plastic resin circuit board is reinforced and thereby allows said semiconductor device to be formed of a reduced thickness.

2. The device according to claim 1, wherein said metal reinforcing layer is formed by at least one kind of metal selected from a group consisting of gold, silver, nickel, aluminum, chromium and molybdenum.

3. The device according to claim 1, wherein the thickness of the metal reinforcing layer is less than 20 μm.

4. The device according to claim 1, wherein said bottom surface of the silicon semiconductor pellet on which the metal reinforcing layer is formed is ground without a mirror finish.

5. The device according to claim 1, wherein said plastic resin circuit board comprises polyimide resin.

6. The device according to claim 1, wherein the thickness of the silicon semiconductor pellet is less than 0.4 mm.

7. The device according to claim 1, wherein said high polymer material comprises epoxy resin.

8. The device according to claim 1, wherein said high polymer material comprises acrylic resin.

9. The device according to claim 1, wherein the metal reinforcing layer is directly formed on the silicon semiconductor pellet from a thin film formed by vacuum deposition.

10. A card like semiconductor device comprising:
a silicon semiconductor pellet having semiconductor circuitry on a top surface and a metal reinforcing layer forming a bottom surface, said metal reinforcing layer including a silicon alloy layer being diffused to said bottom surface;
a plastic resin circuit board having a recessed pellet securing surface larger in surface area than said silicon semiconductor pellet and said recessed pellet securing surface being thinner than a remaining portion surrounding said pellet securing surface in thickness thereof, the bottom of said silicon semiconductor pellet being secured to the recessed pellet securing surface of the plastic resin circuit board by an organic adhesive;
a high polymer material for sealing said silicon semiconductor pellet to said plastic resin circuit board; and
said metal reinforcing layer stiffening the mechanical strength of said silicon semiconductor pellet so that the relatively thin recessed pellet securing surface of said plastic resin circuit board is reinforced and thereby allows said semiconductor device to be formed of a reduced thickness.

11. The device according to claim 10, wherein said metal reinforcing layer is formed by at least one kind of metal selected from a group consisting of gold, silver, nickel, aluminum, chromium and molybdenum.

12. The device according to claim 10, wherein the thickness of the metal reinforcing layer is less than 20 μm.

13. The device according to claim 10, wherein said one bottom surface of the silicon semiconductor pellet on which the metal reinforcing layer is formed is ground without a mirror finish.

14. The device according to claim 10, wherein said plastic resin circuit board comprises polyimide resin.

15. The device according to claim 10, wherein the thickness of the silicon semiconductor pellet is less than 0.4 mm.

16. The card like semiconductor device of claim 10, wherein remaining areas of said plastic resin circuit board, other than said recessed pellet securing surface, are formed thicker than said recessed pellet securing surface to strengthen said semiconductor device without adding thickness thereto.

17. The card like semiconductor device of claim 10, wherein said metal reinforcing layer fails to perform circuit functions.

18. The device according to claim 10, wherein said high polymer material comprises epoxy resin.

19. The device according to claim 10, wherein said high polymer material comprises acrylic resin.

20. A card like semiconductor device comprising:
a card body having a predetermined thickness and providing therein a recessed space with a depth smaller than the thickness of said card body; and
a semiconductor arrangement mounted in the recessed space, said semiconductor arrangement including,
a silicon semiconductor pellet having semiconductor circuitry on a top surface thereof and a metal reinforcing layer forming a bottom surface thereof, said metal reinforcing layer including a silicon alloy layer being diffused to said bottom surface,
a plastic resin circuit board having a relatively thin pellet securing surface to which the bottom surface of said silicon semiconductor pellet is bonded by an organic adhesive,
a high polymer material for sealing said semiconductor arrangement in said recessed space, and
said metal reinforcing layer stiffening the mechanical strength of said semiconductor pellet so that the relatively thin pellet securing surface of said plastic resin circuit board is reinforced and thereby allows said semiconductor device to be formed of a reduced thickness.

21. A card like semiconductor device comprising:
a card body having a predetermined thickness and providing therein a recessed space with a depth smaller than the thickness of said card body; and
a semiconductor arrangement mounted in the recessed space, said semiconductor arrangement including,
a silicon semiconductor pellet having semiconductor circuitry on a top surface and a metal reinforcing layer forming a bottom surface, said metal reinforcing layer including a silicon alloy layer diffused to said bottom surface,
a plastic resin circuit board having a relatively thin recessed pellet securing surface to which the bottom surface of said silicon semiconductor pellet is bonded by an organic adhesive and a circuit pattern formed on a remaining surface portion surrounding said pellet securing surface,
a plurality of wires bonded to said circuitry of said silicon semiconductor pellet and said circuit pattern of said plastic resin circuit board to provide electrical connections therebetween,
a high polymer material for sealing said silicon semiconductor pellet and said plurality of wires in said recessed space;
said semiconductor arrangement having a thickness of less than the depth of the recessed space of said card body and being mounted and sealed in the recessed space, so that the semiconductor arrangement does not exceed the thickness of said card body.

22. The card like semiconductor device of claim 21, wherein said silicon semiconductor pellet is secured in the plastic resin circuit board by an organic adhesive.

23. The card like semiconductor device of claim 21, wherein said metal reinforcing layer stiffens the relatively thin pellet securing surface of said plastic resin circuit board to allow said semiconductor device to be formed of a reduced thickness.

* * * * *

UNITED STATES PATENT AND TRADEMARK OFFICE
CERTIFICATE OF CORRECTION

PATENT NO. : 4,961,105

DATED : Oct. 2, 1990

INVENTOR(S) : Yamamoto

It is certified that error appears in the above-identified patent and that said Letters Patent is hereby corrected as shown below:

TITLE PAGE:

In Section [73], change "Osaku" to --Osaka--.

Signed and Sealed this

Twenty-second Day of September, 1992

*Attest:*

DOUGLAS B. COMER

*Attesting Officer*     *Acting Commissioner of Patents and Trademarks*